US008676523B2

(12) United States Patent
Lebreton (10) Patent No.: US 8,676,523 B2
(45) Date of Patent: Mar. 18, 2014

(54) METHOD OF DETECTING THE POSITION, IN A SIGNAL RECEIVED BY A DETECTOR, OF A WAVEFRONT CORRESPONDING TO AN EVENT

(75) Inventor: Raphaël Lebreton, Montlhery (FR)

(73) Assignee: Alstom Technology Ltd., Baden (CH)

( * ) Notice: Subject to any disclaimer, the term of this patent is extended or adjusted under 35 U.S.C. 154(b) by 59 days.

(21) Appl. No.: 13/502,993

(22) PCT Filed: Oct. 18, 2010

(86) PCT No.: PCT/EP2010/065592
§ 371 (c)(1),
(2), (4) Date: Jul. 2, 2012

(87) PCT Pub. No.: WO2011/048036
PCT Pub. Date: Apr. 28, 2011

(65) Prior Publication Data
US 2012/0264389 A1    Oct. 18, 2012

(30) Foreign Application Priority Data

Oct. 20, 2009 (FR) .................................... 09 57351

(51) Int. Cl.
*G01R 15/00* (2006.01)
*G01M 3/04* (2006.01)
*H04B 17/00* (2006.01)

(52) U.S. Cl.
USPC ............................. 702/57; 455/307; 73/40.5 A (58) Field of Classification Search
USPC ............ 73/40.5 R, 49.1, 49.5, 620, 627, 632, 73/40.5 A, 40; 702/57, 103, 108, 127; 455/67.11, 67.14, 423, 115.1, 115.2, 455/307
See application file for complete search history.

(56) References Cited

U.S. PATENT DOCUMENTS

| 5,388,445 | A | 2/1995 | Walters et al. |
| 6,389,881 | B1 * | 5/2002 | Yang et al. ................. 73/40.5 A |

(Continued)

FOREIGN PATENT DOCUMENTS

| EP | 1 615 049 A1 | 1/2006 |
| EP | 2 098 877 A1 | 9/2009 |
| FR | 2883979 | 3/2005 |

OTHER PUBLICATIONS

International Search Report for International Patent Application No. PCT/EP2010/065592, dated Nov. 29, 2010, in 2 pages.

(Continued)

*Primary Examiner* — Sonny Trinh
(74) *Attorney, Agent, or Firm* — Knobbe Martens Olson & Bear LLP (57) ABSTRACT

A method of detecting the position of a wavefront in a time-varying signal corresponding to an event is disclosed. According to one aspect, the method includes digitizing a signal received by a detector to produce a working signal, filtering the working signal N4 times with a band-pass filter to obtain N4 filtered working signals with different pass-bands, detecting a peak of the N4 filtered working signals to detect the position of a first wavefront as a function of time of occurrence. The N4 points are plotted such that an ordinate is one of the times of occurrence and an abscissa is the width of the associated band. An exponential asymptote that fits a maximum number of the N4 points is applied, and the position of the wavefront is determined as the ordinate of the point that has the maximum abscissa and substantially fits the exponential asymptote.

10 Claims, 9 Drawing Sheets

(56) References Cited

U.S. PATENT DOCUMENTS 6,536,553 B1 * 3/2003 Scanlon .................. 181/108
6,668,619 B2 * 12/2003 Yang et al. ............... 73/40.5 R
7,219,553 B1 * 5/2007 Worthington ............ 73/753
8,224,621 B2 * 7/2012 Ajay et al. ............... 702/176
2006/0015277 A1 1/2006 Bernard et al.

OTHER PUBLICATIONS

Written Opinion for International Application No. PCT/EP2010/065592, dated Nov. 29, 2010, in 9 pages.

* cited by examiner

METHOD OF DETECTING THE POSITION, IN A SIGNAL RECEIVED BY A DETECTOR, OF A WAVEFRONT CORRESPONDING TO AN EVENT

RELATED APPLICATIONS

This application is a U.S. National Phase of International Application No. PCT/EP2010/065592, filed Oct. 18, 2010, which is incorporated by reference in its entirety.

TECHNICAL FIELD

The present invention relates to a method of detecting the position of a wavefront reflecting the occurrence of a looked-for event in a time-varying signal received by a detector, even if that signal propagates in an environment polluted by noise and the detector also receives the noise superposed on the signal. The signal may be an acoustic signal, an electromagnetic signal such as a radio-frequency signal, or an electromechanical signal such as vibration emanating from an electromechanical device in an equipment. By way of example, the looked-for event may be a partial discharge in electrical equipment, activation of a voice source in a space, a pressure transient in a pipeline, etc.

The present invention can be used in particular in methods of detecting and locating sources of partial discharges in electrical equipment such as power transformers or electrical machines. Partial discharges in electrical equipment are associated with the emission of an acoustic (generally ultrasonic) signal. A "wavefront" in the signal therefore reflects the occurrence of the partial discharge and thus a fault. The term wavefront refers to the portion of a wave situated between a virtual point of given amplitude and a peak value higher than the given amplitude that follows on immediately from this virtual point of given amplitude. The time-varying signal to be monitored is monotonic before the occurrence of the wavefront. If this signal is buried in background noise, however, the background noise gives rise to localized peaks upstream of the wavefront that can be mistaken for wavefronts of the signal received by the detector.

This application to electrical equipment is not limiting on the invention, since many other applications could be of relevance, for example in the fields of sonar, location of a voice source in a space, or pipeline surveillance.

BACKGROUND

For example, patent application FR 2 883 979 and U.S. Pat. No. 5,388,445 disclose methods of detecting peaks, i.e. wavefronts, in a time-varying signal based on windowing the signal, determining an indicator appropriate to the signal calculated in each window and a threshold, and comparing the indicator with the threshold, a wavefront being detected if the indicator exceeds the threshold. In U.S. Pat. No. 5,388,445, the indicator is a slope. In patent application FR 2 883 979 the indicator is the root-mean-square of the energy of the signal. The threshold employed for comparison depends on the indicator determined over windows preceding that in which the comparison is to take place. In a great number of situations those methods can detect the position of a wavefront in the signal, but no verification is effected to be sure that the detected wavefront corresponds to the looked-for event, which in the above documents is a partial discharge or a pressure transient. The detected wavefront could correspond to noise.

Furthermore, if the signal received by the detector is very noisy, the threshold may have an amplitude higher than the maximum amplitude of the signal, making detection impossible. Also, the looked-for wavefront cannot be detected if the signal received by the detector is subject to interference in the form of low-frequency noise, because it will have an amplitude lower than the maximum amplitude of the signal affected by the low-frequency noise. Thus with a single search for the occurrence of a wavefront it is not possible to be sure that a detected wavefront corresponds to the looked-for event.

SUMMARY OF CERTAIN INVENTIVE ASPECTS

The aim of the present invention is to propose a method of detecting the position of a wavefront reflecting the occurrence of a looked-for event in a time-varying signal received by a detector, which method is much more reliable than prior art methods even if the noise in the signal received by the detector is distributed over a wide range of frequencies.

The basic idea is to filter the signal received by the detector several times using a band-pass filter and varying the size of the pass-band of the band-pass filter. Applying the band-pass filter delays the filtered signal exponentially as the pass-band decreases. Each of the filtered signals is processed to look for a wavefront. All wavefronts identified are grouped to determine whether they follow an exponential asymptote. The position of the wavefront corresponding to the looked-for event is found with the aid of the exponential asymptote.

More precisely, the present invention provides a method of detecting the position of a wavefront reflecting the occurrence of a looked-for event in a time-varying signal received by a detector, wherein:

the signal received by the detector is digitized to produce a working signal;

the working signal is filtered N4 times (N4 is an integer greater than or equal to 3) with a band-pass filter, while varying the width of the pass-band of the band-pass filter N4 times, the N4 pass-bands being contained one within another from the widest to the narrowest, to obtain N4 filtered working signals;

each of the N4 filtered working signals is processed by a peak detection method to detect in each signal the position of a first wavefront in terms of time of occurrence;

the width of the pass-band with which the working signal was filtered is associated with each time of occurrence;

N4 points are defined, each having an ordinate that is one of the times of occurrence and an abscissa that is the width of the associated band;

the N4 points are placed in a Cartesian system of axes; and a search is made for an exponential asymptote that fits a maximum number of the N4 points, the position of the wavefront reflecting the occurrence of the looked-for event being the ordinate of a point that has the largest abscissa and is on or virtually on the exponential asymptote.

To determine the extreme pass-bands of the band-pass filter, a discrete Fourier transform may be calculated using N1 samples of the working signal (N1 is an integer) and used to define the bounds of the narrowest pass-band and the bounds of the widest pass-band.

To be more precise, in order to define the upper and lower bounds of the narrowest pass-band and the widest pass-band the N2 samples having the greatest amplitude may be selected in the discrete Fourier transform (N2 is an integer less than N1), the narrowest pass-band may be assigned a lower bound that is the lowest frequency of the N2 samples and an upper bound that is the highest frequency of the N2 samples, the N3 samples having the greatest amplitude may be selected in the discrete Fourier transform (N3 is an integer much greater than N2 but less than N1), and the widest pass-band may be assigned a lower bound that is the lowest frequency of the N3 samples and an upper bound that is the highest frequency of the N3 samples. Two conditions are verified, namely that the widest pass-band and the narrowest pass-band have at least one lower bound or one upper bound that is different, and that the narrowest pass-band is contained within the widest pass-band; if this is not so, at least one of the bounds of the narrowest pass-band and/or of the widest pass-band is shifted so that the two conditions are satisfied.

To eliminate the noise, the discrete Fourier transform is preferably smoothed before defining the bounds of the narrowest pass-band and the bounds of the widest pass-band.

In addition to the extreme pass-bands, one or more intermediate pass-bands contained one within another are defined by subdividing a first interval, if it exists, between the lower bound of the widest pass-band and the lower bound of the narrowest pass-band into N+1 parts (N is an integer greater than or equal to 1) and/or subdividing a second interval, if it exists, between the upper bound of the widest pass-band and the upper bound of the narrowest pass-band into N+1 parts, an interface between two adjacent parts of the first interval forming a lower bound of an intermediate pass-band and an interface between two adjacent parts of the second interval forming an upper bound of an intermediate pass-band.

To facilitate the search for the exponential asymptote, when placing the N4 points in the Cartesian system of axes, the ordinates of the N4 points may be moved in translation through a distance such that after the movement in translation, the point having the lowest ordinate has an ordinate of virtually zero.

The position of the wavefront corresponding to the looked-for event is then corrected by adding the translation distance to it.

If a large number of points is available, in order to facilitate the search for the exponential asymptote it is possible, before the exponential asymptote search step, to select a triplet of points having successive increasing abscissas, to verify that the ordinates of these three points are decreasing, to discard any of the points of the triplet if it does not satisfy this decreasing ordinate condition, and to repeat this verification progressively with a next triplet including at least one point from the preceding triplet.

To be able to construct as realistically as possible an exponential asymptote it is prudent to stop the comparison as soon as the number of points discarded reaches N4/2.

The method of the invention is particularly suitable if, the detector being an acoustic detector, the looked-for event is a partial discharge caused by a partial discharge source in electrical equipment placed in an enclosure containing an acoustically-conductive fluid.

While the present invention is described herein in connection with certain embodiments, it is to be understood that the invention is not limited to the disclosed embodiments, but, on the contrary, is intended to cover various modifications and equivalent arrangements included within the spirit and scope of the appended claims, and equivalents thereof.

BRIEF DESCRIPTION OF THE DRAWINGS

The present invention can be better understood after reading the description of embodiments given by way of purely indicative and nonlimiting example with reference to the appended drawings, in which:

FIG. 6C shows an enlargement of the signal from FIG. 6B, FIGS. 6D and 6E show working signals with low noise measured in the laboratory, the arrow indicating the position of the wavefront detected by a conventional method with only one filtering operation;

Identical, similar or equivalent parts in the various figures carry the same reference numbers to facilitate moving from one figure to another.

To make the figures easier to read, the various parts shown in the figures are not necessarily drawn to the same scale.

DETAILED DESCRIPTION OF CERTAIN EMBODIMENTS

Figure 1:
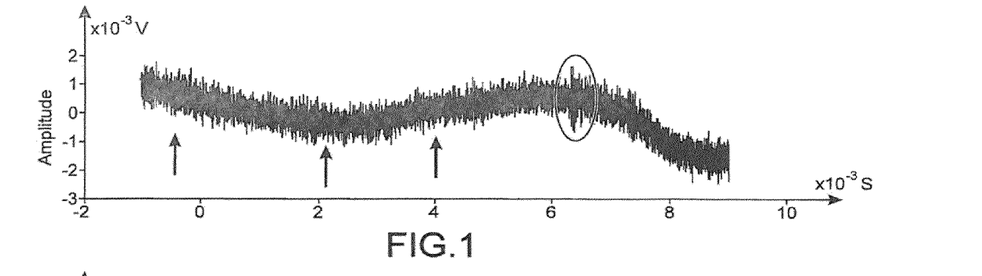
FIG. 1 shows a time-varying signal to which the method of the invention can be applied.

There is represented in FIG. 1 a time-varying signal, for example of acoustic type, to be analyzed and acquired by a detector. It is required to detect the position in this signal of a wavefront corresponding to the occurrence of a looked-for event, for example the occurrence of a partial discharge in electrical equipment.

Figure 8:
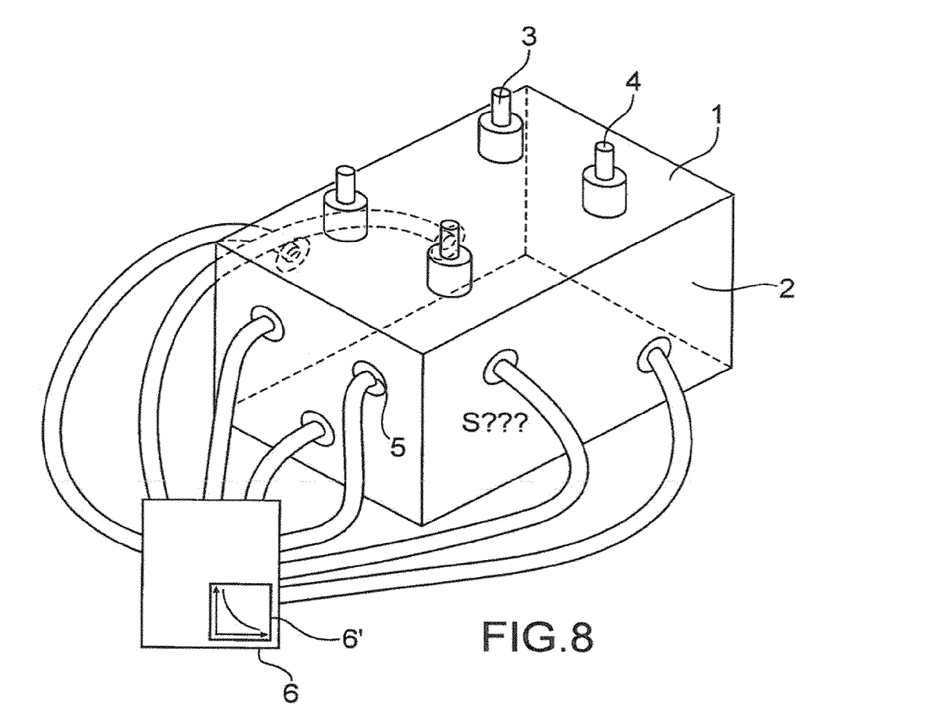
FIG. 8 shows a power transformer to which the method of the invention is applied.

If that equipment is a power transformer 1, for example, as shown in FIG. 8, it is generally housed in an enclosure 2 containing a conductive fluid such as oil or sulfur hexafluoride. The detector 5 is placed outside the enclosure 2, in contact with one of its walls. It can be an ultrasound detector 5 or an ultra high frequency (UHF) detector. A plurality of detectors 5 are often used on each wall. The detectors 5 are connected to means 6 for acquiring and processing the signals they receive. The acquisition and processing means 6 include analog-to-digital converter means, digitized signal storage means, calculation means for performing spectrum analysis, and filter means. The acquisition and processing means 6 may include display means 6.1. A high-voltage bushing 3 and a low-voltage bushing 4 connected to the transformer pass through the enclosure 2. The occurrence of a partial discharge produced by a source S is the looked-for event.

The oval in FIG. 1 marks the wavefront reflecting the looked-for event, which in the example discussed here is a partial discharge. However, the signal acquired by the detector is noisy; the arrows indicate low-frequency noise peaks preceding the occurrence of the partial discharge and that could be mistaken for the partial discharge when looking for it by prior art methods like those described in the above-mentioned two patents, for example.

The method of the invention for detecting the position of a wavefront reflecting the occurrence of a looked-for event is described below. It begins with processing the signal delivered by the detector. The signal is digitized by means of an analog-to-digital converter connected to the detector. The working signal is used more than once and is therefore stored. This digital signal is called thereafter the working signal.

The basic idea of the present invention is to filter the working signal several times using a band-pass filter of pass-band width that is varied, the pass-bands used for these filtering steps being interleaved with one another. How to determine the pass-bands of the band-pass filter is explained below.

Figure 2A:
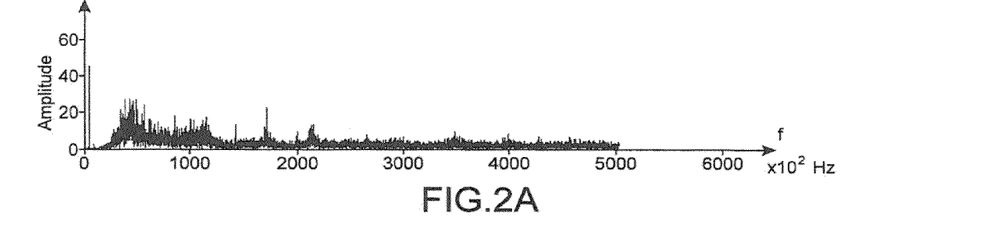
FIGS. 2A, 2B respectively show the discrete Fourier transform and the smoothed discrete Fourier transform of a time-varying signal to which the method of the invention can be applied.

The first step is to use a spectrum analyzer to calculate the discrete Fourier transform of the working signal, for example using the fast Fourier transform (FFT). The fast Fourier transform is a calculation algorithm for transforming a digital signal as a function of time into a digital signal as a function of frequency. FIG. 2A shows the signal corresponding to the discrete Fourier transform obtained. This discrete Fourier transform includes N1 samples. N1 is an integer. The person skilled in the art seeking to detect the occurrence of a partial discharge from this signal is aware that the first peak appearing at a low frequency is likely to be noise.

To avoid such noise it is preferable to smooth the signal corresponding to the discrete Fourier transform obtained. Smoothing can be effected by transforming each of the N1 samples of the discrete Fourier transform into the mean of the M samples that precede it and the M samples that follow it. M is a non-zero integer and can have a value between approximately 10 and 30, for example, depending on the sampling frequency of the signal corresponding to the discrete Fourier transform and thus according to the value of N1. This smoothing step is optional. The remainder of the description refers to the smoothed signal, but the unsmoothed signal could serve equally well.

Figure 2B:
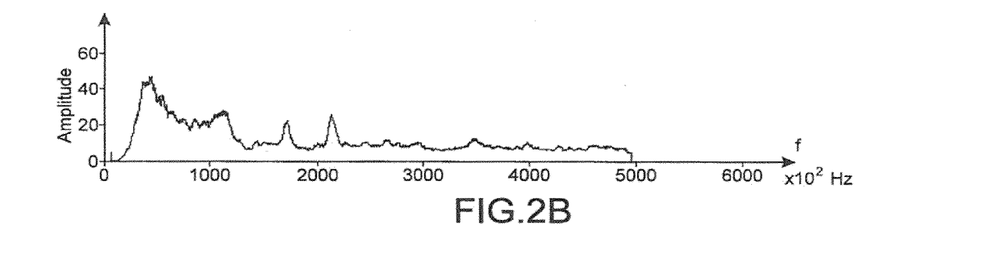

FIG. 2B shows the signal corresponding to the discrete Fourier transform after smoothing. Note that the first peak corresponding to noise has been greatly reduced. Note also in these two FIGS. 2A and 2B that very low frequencies below 1 kHz and very high frequencies above 500 kHz have been eliminated, since they are not significant in this application to detecting partial discharges generated in electrical equipment.

The next step is to set the bounds of the extreme pass-bands $\beta$min, $\beta$max of the band-pass filter, i.e. the bounds of the narrowest pass-band $\beta$min and the widest pass-band $\beta$max of the band-pass filter. These bounds are set using the signal corresponding to the discrete Fourier transform, where applicable the smoothed transform.

Figure 3:
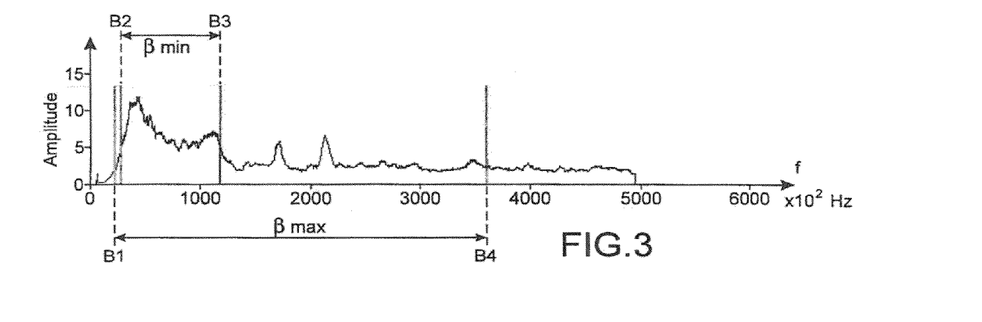
FIG. 3 shows the smoothed discrete Fourier transform from FIG. 2B with the extreme pass-bands and their lower and upper bounds.

Refer now to FIG. 3. To determine the bounds of the narrowest pass-band $\beta$min, the N2 samples having the greatest amplitude are selected from the N1 samples of the smoothed discrete Fourier transform shown in FIG. 3 and the frequency to which they correspond is determined. N2 is an integer less than N1. It can be a fraction of N1. If N1 has the value 5000, for example, N2 can have a value that is 1/20 of that value, for example, i.e. 250. In these N2 samples, the highest frequency and the lowest frequency are selected, the lowest frequency forming the lower bound B2 of the narrowest pass-band $\beta$min and the highest frequency forming the upper bound B3 of the narrowest pass-band $\beta$min.

Figure 4:
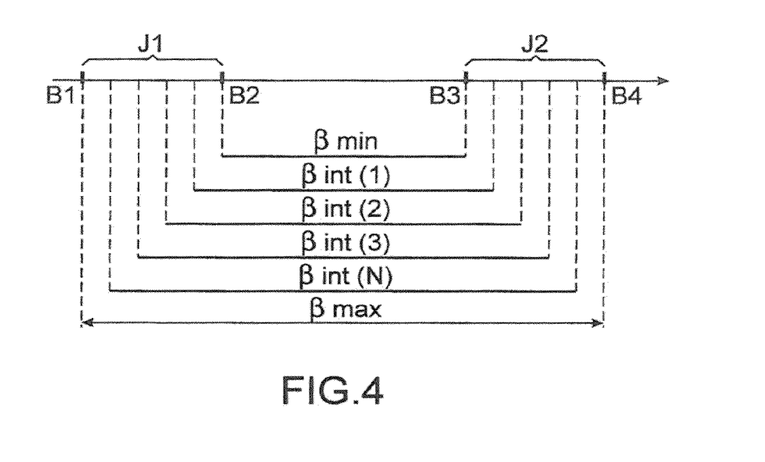
FIG. 4 shows the interleaving of the extreme pass-bands and the intermediate pass-bands of the band-pass filter.

To determine the bounds of the widest pass-band $\beta$max, the N3 samples having the greatest amplitude in FIG. 3 are selected and the frequency to which they correspond is determined. N3 is an integer less than the total number N1 of samples in the signal corresponding to the discrete Fourier transform and N3 is very much higher than N2. In the example described, N3 can be made ten times greater than N2, i.e. N3=2500. In these N3 samples, the highest frequency and the lowest frequency are selected, the lowest frequency forming the lower bound B1 of the widest pass-band $\beta$max and the highest frequency forming the upper bound B4 of the widest pass-band $\beta$max. FIG. 4 shows the extent of the extreme pass-bands. It is verified that the two pass-bands $\beta$min, $\beta$max are different, i.e. that the lower bounds B1 and B2 do not coincide and simultaneously that the upper bounds B3 and B4 do not coincide. It is nevertheless possible for the two extreme pass-bands $\beta$min, $\beta$max to have a common lower bound or a common upper bound. The narrowest pass-band $\beta$min is contained within the widest pass-band $\beta$max. The two extreme pass-bands $\beta$min, $\beta$max can be separate or have a one bound in common, but not both. The bounds B1, B2, B3, B4 must satisfy the following conditions: B1 less than or equal to B2 and B3 strictly less than B4 or B1 strictly less than B2 and B3 less than or equal to B4. Two conditions must therefore be satisfied, namely that the widest pass-band $\beta$max and the narrowest pass-band $\beta$min have at least one different lower bound B1, B2 or one different upper bound B3, B4 and the narrowest pass-band $\beta$min is contained in the widest pass-band $\beta$max; if this is not so, one of the bounds of the narrowest pass-band or the widest pass-band is shifted so that the two conditions are satisfied.

Thus the working signal is filtered N4 times, where N4 is an integer greater than or equal to 3. N4 filtered working signals are obtained. The working signal is filtered twice with a band-pass filter of pass-band that has firstly the value $\beta$min and secondly the value $\beta$max. Two filtered signals are then obtained.

However, to obtain the N4 filtered working signals with N4 greater than or equal to 3, there are further defined one or more intermediate pass-bands $\beta$int(1), $\beta$int(2), ..., $\beta$int(N) contained one within another from the narrowest $\beta$int(1) to the widest $\beta$int(N) if there is more than one. If there is only one, the intermediate pass-band $\beta$int(1) is contained in the widest extreme pass-band $\beta$max and contains the narrowest extreme pass-band $\beta$min.

To define the extreme bounds of the intermediate pass-bands $\beta$int(1), $\beta$int(2), ..., $\beta$int(N), it suffices to subdivide into N+1 parts the interval I1 between the lower bounds B1, B2 of the two extreme pass-bands $\beta$min, $\beta$max and/or into N+1 parts the interval I2 between the upper bounds B3, B4 of the two extreme pass-bands $\beta$min, $\beta$max. N is an integer greater than or equal to two. This subdivision is of course affected only if the interval I1 or the interval I2 exists. If the extreme pass-bands $\beta$min, $\beta$max have a common bound, the corresponding interval is zero.

An interface exists between two adjacent parts of the first interval I1, this interface forming a lower bound of an intermediate pass-band, and an interface exists between two adjacent parts of the second interval I2, this interface forming an upper bound of an intermediate pass-band. The interfaces are represented by crosses in FIG. 4.

The parts of the same interval I1 or I2 can be equal or not. If the intervals I1 and I2 are unequal and the parts of the first interval I1 are equal and the parts of the second interval I2 are equal, this amounts to stating that the narrowest extreme pass-band $\beta$min will be enlarged at its lower bound B2 by a step p1 and at its upper bound by a step p2 in order to sweep the intermediate pass-bands.

Finally, there are therefore N4 pass-bands where N4=N+2, i.e. the two extremes pass-bands, βmin and the N intermediate pass-bands βint(1), βint(2), ..., βint(N).

The number N4 is preferably made as large as possible to obtain more pass-bands for filtering. Account must nevertheless be taken of the fact that the greater N4, the longer the calculation time. For choosing N4, it is also necessary to take account of the power of the calculator available. The number N4 can for example be equal to 20 in the situation illustrated in FIG. 4.

The working signal is therefore filtered N4 times with a band-pass filter of pass-band that varies from βmin to βmax via βint(1), βint(2), ..., βint(N). Filtering can equally well be effected from the narrowest pass-band to the widest pass-band or conversely from the widest pass-band to the narrowest pass-band, the aim being to effect the filtering with the N4 pass-bands.

N4 filtered signals are therefore obtained from which the position of the wavefront corresponding to the looked-for event is deduced.

There is applied to each of these N4 filtered signals a conventional wavefront position search method, i.e. a method of searching for a peak in a time-varying signal. The method generally uses an indicator and a threshold depending on the filtered working signal. That disclosed in patent application FR 2 883 979 may be used, for example. That method is based on windowing the filtered signal using a sliding window, calculating the energy of the signal including an optimum number of samples in the sliding window, calculating the root-mean-square of the energy, and thresholding the root-mean-square using a threshold that is a function of the root-mean-square in a given window. Thus when the root-mean-square exceeds the threshold for the first time, the position of the wavefront has been detected. Since the signal used to locate it is a time-varying signal, this position is a position in time, i.e. a time of occurrence. Other methods of searching for peaks in a time-varying signal can be used, for example that described in U.S. Pat. No. 5,388,445. More generally, these methods window the signal, determine an indicator appropriate to the signal calculated in each window and a threshold, and compare the indicator to the threshold, a wavefront being detected if the indicator exceeds the threshold.

Once the position of the wavefront has been identified in each of the N4 filtered working signals, it is verified whether those wavefronts do or do not correspond to the looked-for event and the position of the wavefront is deduced from this as accurately as possible.

Each wavefront position is made to correspond to the width of the pass-band of the band-pass filter used. Thus N4 points are obtained and placed in a Cartesian system of axes having on the ordinate axis the position of the wavefront, i.e. its time of occurrence, and on the abscissa axis the width of the pass-band. If the N4 points correspond to the same wavefront, they lie on or virtually on an exponential asymptote (see FIGS. 5A, 5B, 5C).

The effect of filtering a digital signal is to delay the filtered digital signal relative to the digital signal before filtering. If filtering is effected using a band-pass filter, the delay caused by filtering varies exponentially with the width of the pass-band of the filter.

Figure 5A:
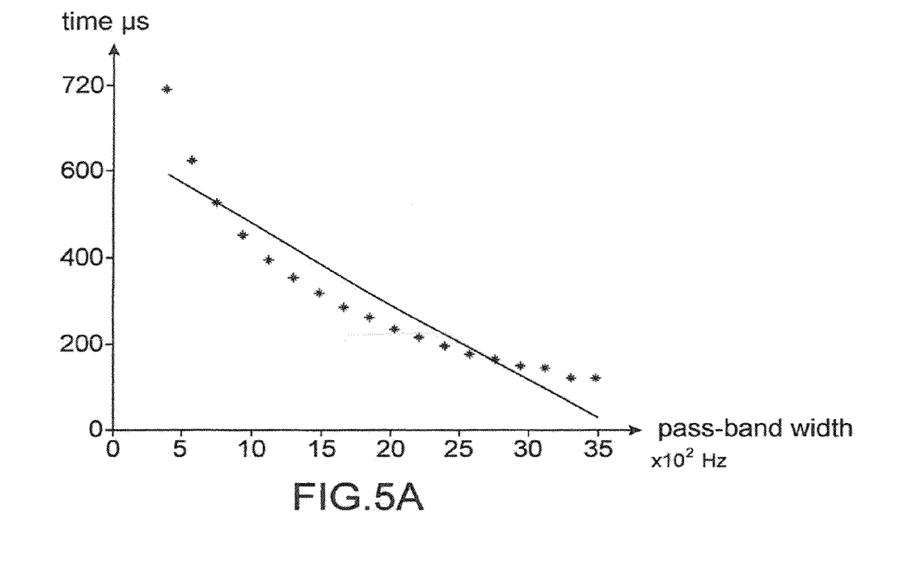
FIGS. 5A, 5B, 5C show the exponential asymptote.
Figure 5B:
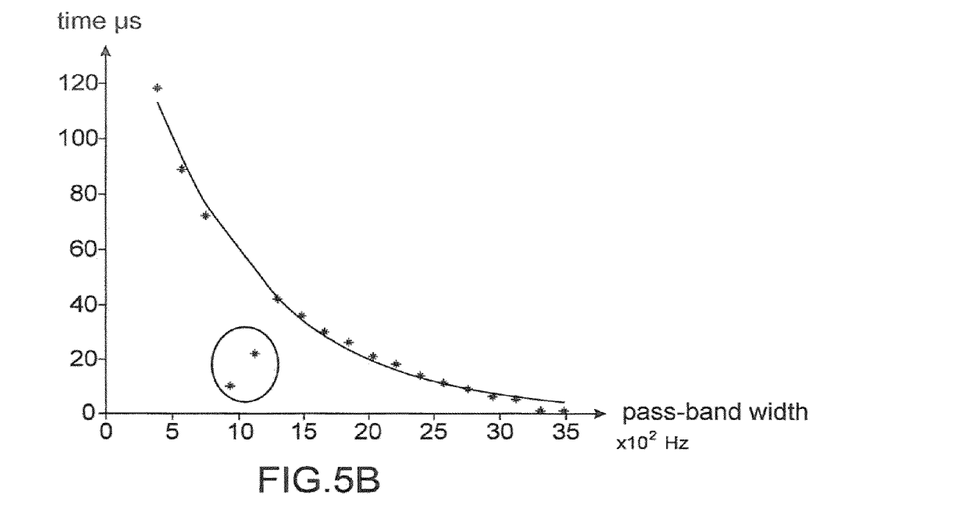

Thus the aim is to find an exponential asymptote that passes through the greatest possible number of points. The exponential asymptote looked-for is a decreasing curve that tends toward infinity for the narrowest pass-bands and towards zero for the widest pass-bands. In FIG. 5A, the ordinate values vary over a range from 580 to 720 microseconds. It can be difficult to determine the exponential asymptote if most of the points determined have an abscissa far from zero and therefore from the ordinate axis. To facilitate the search for the asymptote, it is preferable to move the range of values in translation on the ordinate axis, on which points are found, towards the abscissa axis by a given distance called the translation distance. FIG. 5B illustrates this variant, in which the translation distance has a value 600 microseconds. The former ordinate at 600 microseconds now corresponds to 0 seconds. To choose the translation distance, it is sufficient for the smallest ordinate to have, after movement in translation, a value that is almost zero but that is not zero.

Note in FIG. 5B that two points do not fit the exponential asymptote on which the other points are grouped. This means that these points are dependent on noise and not on a filtered signal that shifts exponentially as a function of the width of the pass-band of the band-pass filter used. These two points thus have to be discarded, which has been done in FIG. 5C.

Working from this representation, the position of the wavefront corresponding to the looked-for event is the ordinate of the point on or virtually on the exponential asymptote that has the maximum abscissa and therefore corresponds to the widest pass-band. Filtering causes the minimum delay at this point. It is seen that the delay caused by filtering is negligible. In the prior art this delay did not exist, of course. However, in the method of the invention, it is certain that the identified wavefront corresponds to the looked-for event, whereas in the prior art the identified wavefront could correspond to noise without this being realized.

Figure 5C:
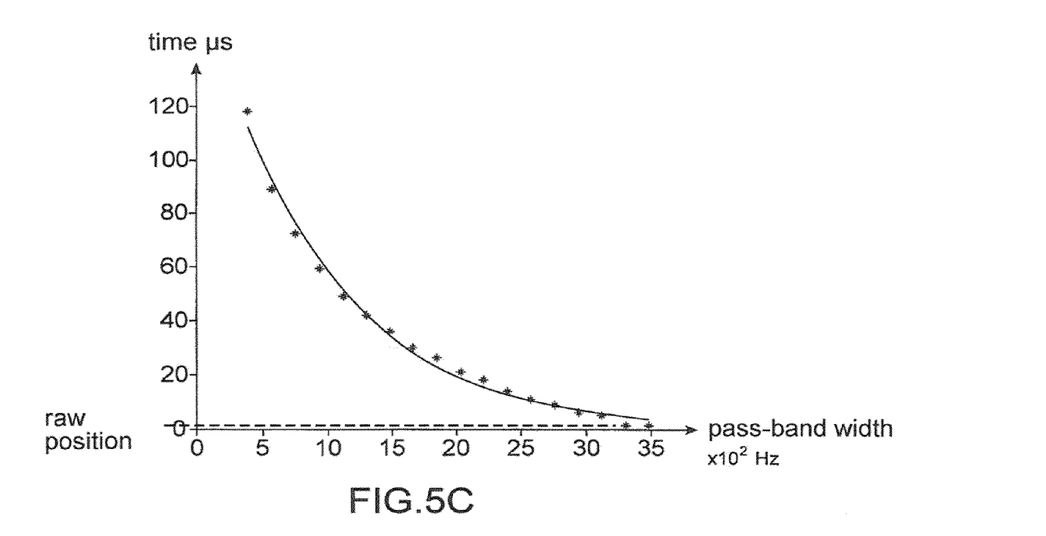

The position detected is in fact a raw position if the points have been moved in translation. In FIG. 5C, the raw position corresponds to 2 microseconds. The last two points whose ordinate is close to zero are too far from the exponential asymptote and are discarded. If a movement in translation has been effected to look for the exponential asymptote, the ordinate found, i.e. the raw position, clearly has to be corrected and the translation distance added to it in order to obtain the looked-for position. The looked-for position is then at the time of 602 microseconds.

To facilitate the search for the exponential asymptote, given that a large number of pass-bands have been used for filtering and that the number N4 is large (for example several hundred), before searching for the exponential asymptote it is possible to verify the ordinate of each point relative to the ordinate of its nearest neighbors, both that which precedes it and that which follows it on the abscissa axis. A rank in the range 1 to N4 is assigned to each point, the point of rank 1 having the smallest abscissa and the point of rank N4 having the largest abscissa. This verifies that in a triplet of points of order P−1, P, P+1 having successive abscissas, the three points of the triplet have decreasing ordinates, i.e. that an intermediate point of rank P between 2 and N4 has an ordinate lower than that of the point of rank P−1 that precedes it on the abscissa axis and an ordinate higher than that of the point of rank P+1 that follows it on the abscissa axis. If this is not so, this means that one of the three points of the triplet interrupts the decreasing trend of the ordinates and must be discarded. The process continues point by point, with the triplet of points of rank P, P+1, P+2 or with the triplet of rank P−2, P−1, P. More generally, another triplet is used having two points in common with the preceding triplet, or possibly only one if a point has been discarded after verification. These successive verifications continue up to the last point, discarding any point from a triplet that does not satisfy the condition that the ordinates decrease as the abscissas increase.

However, there must finally remain an integer number N5 of points that is sufficient for calculating the exponential asymptote, this number N5 being greater than or equal to N4/2. If insufficient points remain after verifying the ordinates of the points taken two by two, this means that insufficient pass-bands were used for filtering and more must be added.

The method of the invention therefore verifies that a wavefront detected in the filtered working signal does not correspond to noise but to the looked-for event. Filtering with the different pass-bands eliminates some noise and looking for the exponential asymptote eliminates more noise.

Calculating the exponential asymptote is simplified if the step of comparing the ordinates of two adjacent points is effected and this further reduces the impact of noise on the calculation of the asymptote.

The determination method of the invention takes longer than the prior art methods because the filtering must be repeated N4 times and the exponential asymptote must be determined. However, the result obtained is much more reliable than in the past.

Figure 6A:
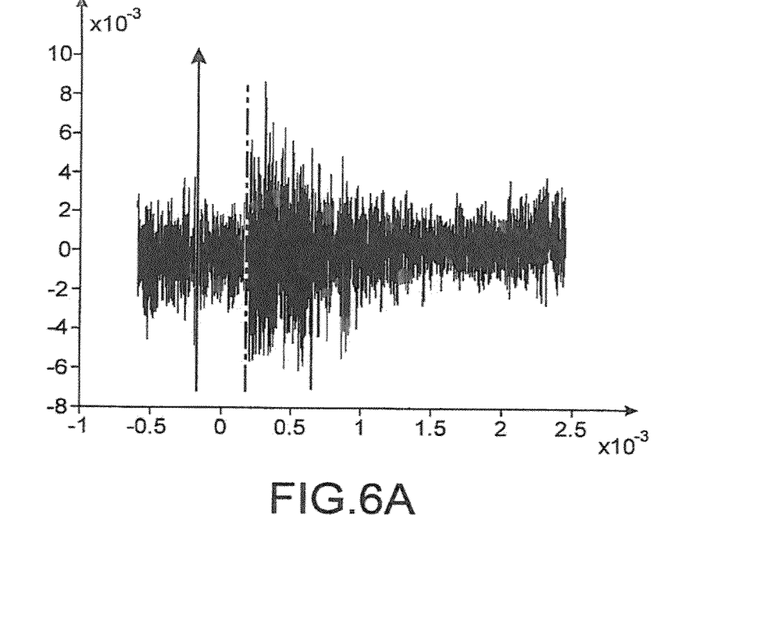
FIG. 6A shows a very noisy working signal measured on site.

There are described below three digitized working signals obtained from a measurement effected by an acoustic detector in electrical equipment such as a transformer. In FIG. 6A, the measurement is effected on an operating site, in FIG. 6B the measurement is effected in a factory, and in FIG. 6D the measurement is effected in a laboratory. The signals contain progressively less noise. The continuous line arrow marks the position of the wavefront detected by a standard wavefront detection method, the working signal being filtered only once by one band-pass filter.

The detected wavefront indicated in FIG. 6A by a continuous line does not correspond to the looked-for event (a partial discharge). The looked-for event occurs at the time marked by the chain-dotted line. The standard method is therefore unable to detect the occurrence of the partial discharge. The same applies to FIG. 6B. The two environments are too noisy for the automatic wavefront search to be reliable. The search detects an earlier wavefront caused by noise. The FIG. 6C curve is an enlargement of the FIG. 6B curve around the detected wavefront. FIG. 6D shows a working signal measured inside a Faraday cage in a laboratory, which provides an environment shielded from noise external to the cage. The prior art method identifies the position of the wavefront corresponding to the looked-for event or it does not, depending on the characteristics of the signal. In FIG. 6D the position detected is reliable and in FIG. 6E the position detected is not reliable. In FIG. 6E, the signal is very clear at the start and the indicator used in the conventional wavefront detection method is too sensitive. The smallest pulse will look like the wavefront corresponding to the looked-for event. Using a less sensitive indicator would prove to be a problem in the event of a noisier signal or a signal having a less sharp wavefront, as in FIG. 6D.

Figure 7A:
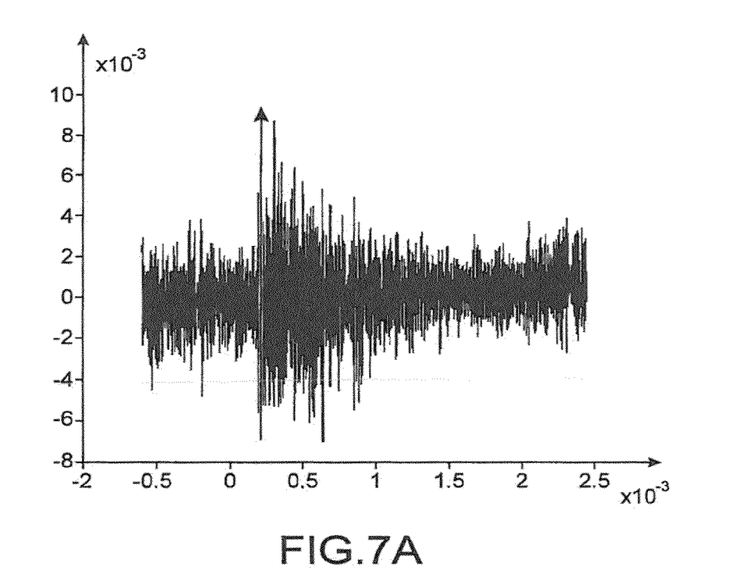
FIG. 7A shows the very noisy working signal measured on site from FIG. 6, FIGS. 7B1 to 7B9 show the same very noisy working signal measured on site filtered using different pass-bands interleaved with one another.
Figure 7B:
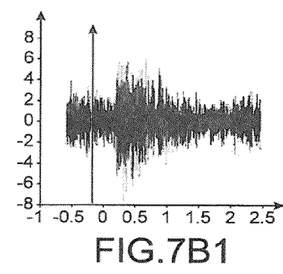
Figure 7B:
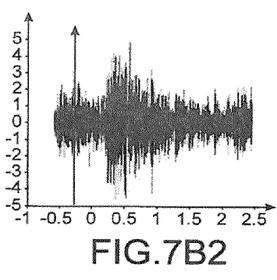
Figure 7B:
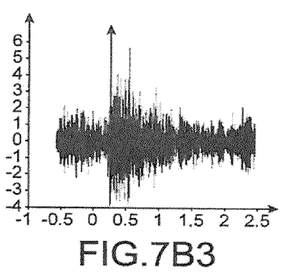
Figure 7B:
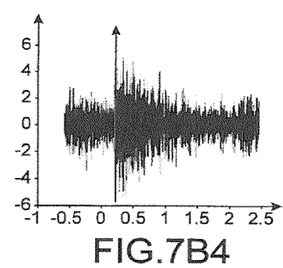
Figure 7B:
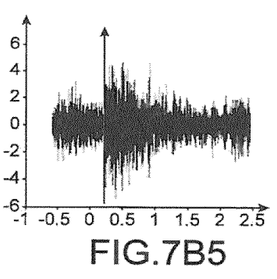
Figure 7B:
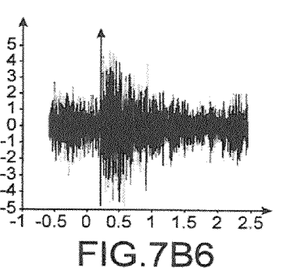
Figure 7B:
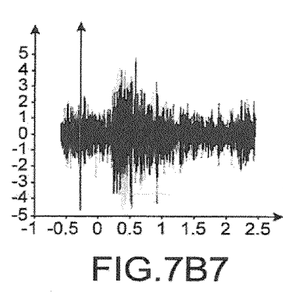
Figure 7B:
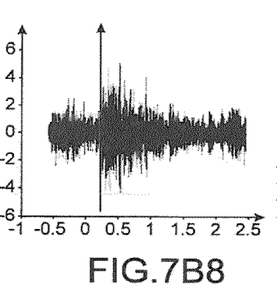
Figure 7B:
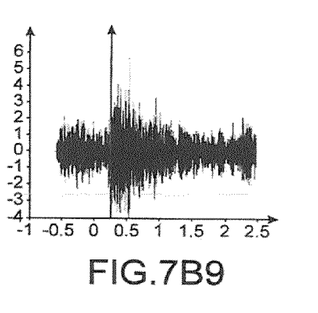

In FIG. 7A there is shown the working signal from FIG. 6A to which the method of the invention has been applied with iterative multiple filtering. The wavefront detected corresponds to the looked-for event and not to noise. Its position is marked by the vertical arrow. Filtering has been applied nine times, as shown in FIGS. 7B1 to 7B9. The pass-band of the band-pass filter used reduces gradually from FIG. 7B1 to FIG. 7B9. The detected positions are not satisfactory in FIGS. 7B1, 7B2, 7B7. Clearly, at the outset, the signal has not been filtered much (FIGS. 7B1, 7B2) but it is seen that the result is not always satisfactory with a given narrower filter (FIG. 7B7).

Figure 6B:
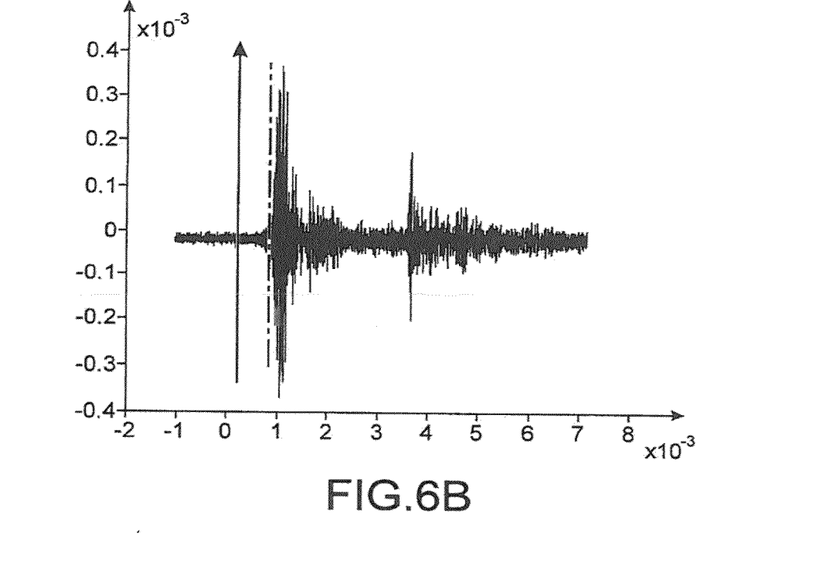
FIG. 6B shows a noisy working signal measured in a factory.
Figure 6C:
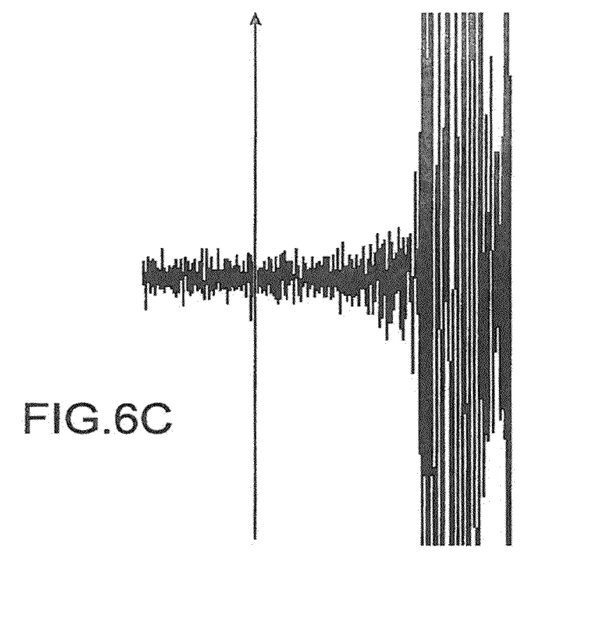
Figure 6D:
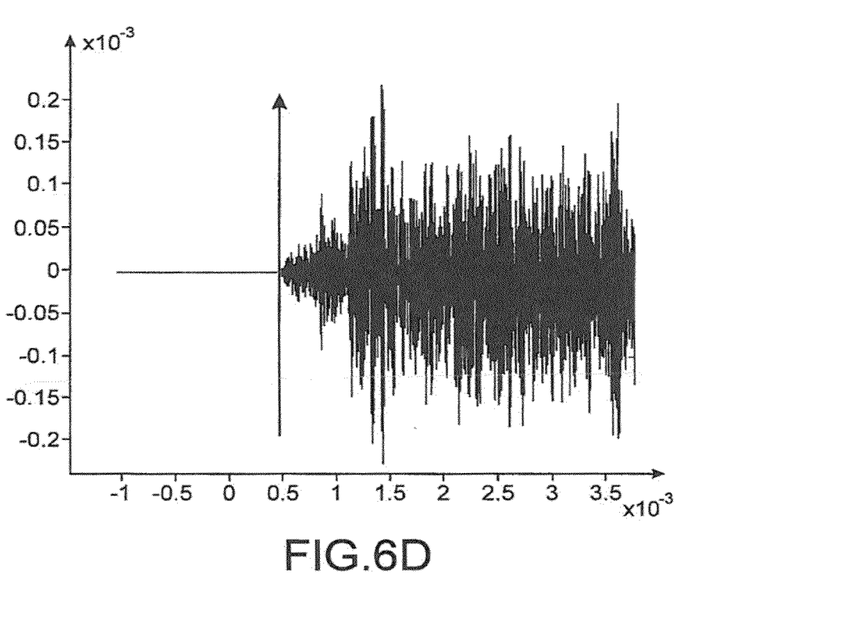
Figure 6E:
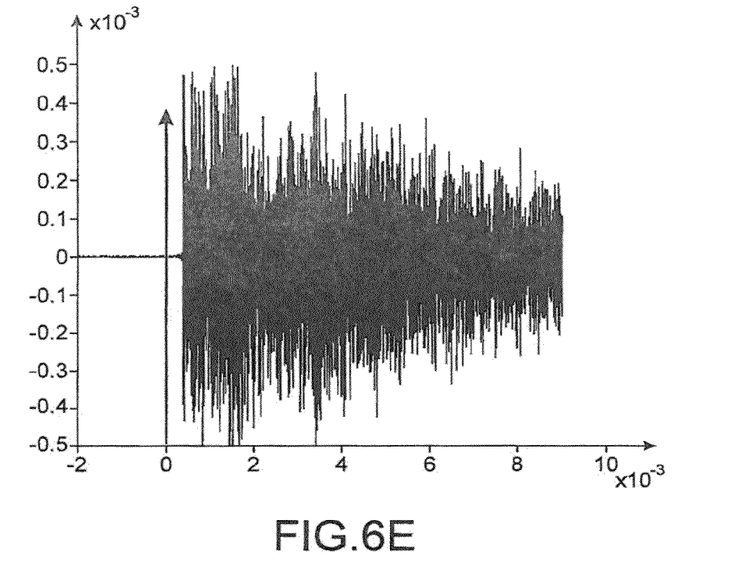
Figure 7C:
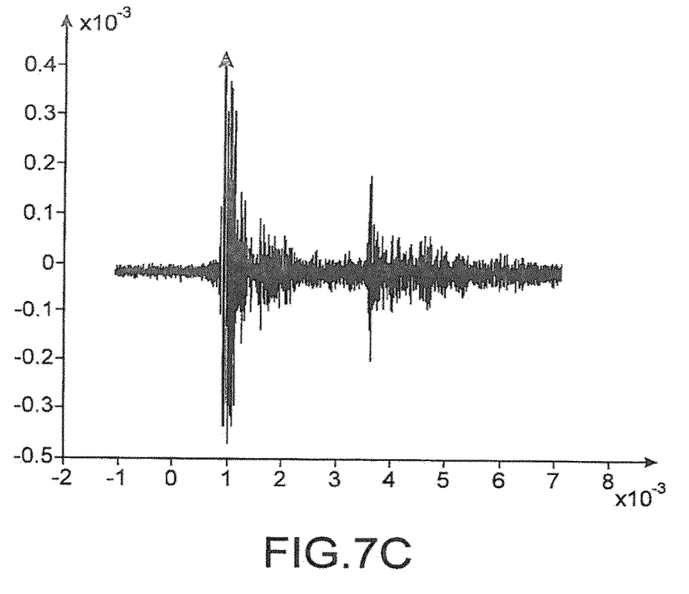
FIG. 7C shows the noisy working signal measured in a factory from FIG. 6B, FIGS. 7D and 7E show the working signals with low noise measured in the laboratory from FIGS. 6D and 6E, the arrow indicating the position of the wavefront detected in FIG. 7A and FIGS. 7B1 to 7B9 after a single filtering operation and in FIGS. 7C, 7D, 7E by the method of the invention.

FIG. 7C shows the position of the wavefront obtained using the method of the invention with nine iterative filtering operations starting with the working signal measured in the factory from FIG. 6B. Detection is much more reliable. Note that the detected position is slightly delayed relative to that indicated in chain-dotted line in FIG. 6B. This delay is caused by the filtering and is negligible.

Figure 7D:
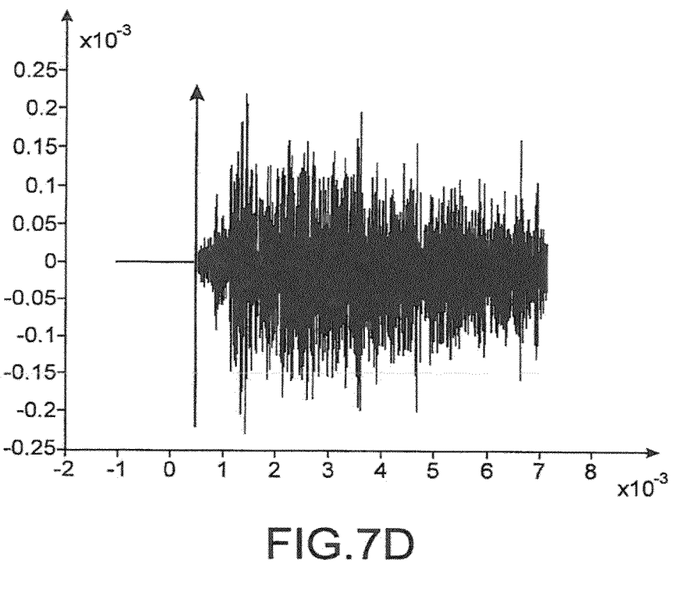
Figure 7E:
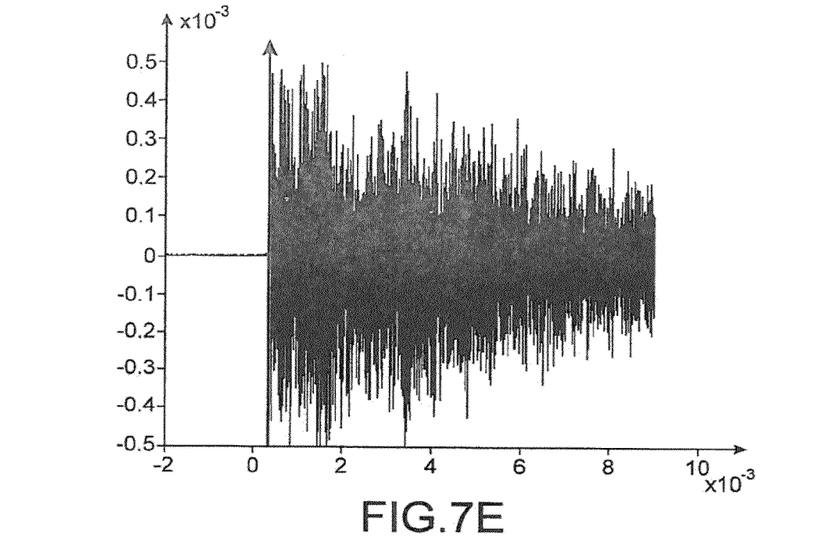

FIGS. 7D and 7E take the signals from FIGS. 6D and 6E. For these two signals the iterative filtering solution gives highly satisfactory results.

In situations where the conventional method would give satisfactory results, as in FIG. 6D, the method of the invention leads to detection with no or practically no delay because all the points detected during the various filtering operations are on the exponential asymptote.

Clearly various changes and modifications can be made to the examples described without departing from the scope of the invention. In particular, other peak search methods can be used. The values given of the numbers M, N, N1, N2, N3, N4 are not limiting on the invention, and can obviously be changed as a function of the signal samples taken into account.

What is claimed is:
1. A method of detecting the position of a wavefront reflecting the occurrence of a looked-for event in a time-varying signal received by a detector, the method comprising:
   digitizing the signal received by the detector to produce a working signal;
   filtering the working signal N4 times, where N4 is an integer greater than or equal to 3 with a band-pass filter while varying the width of the pass-band of the band-pass filter N4 times to generate N4 pass-bands to obtain N4 filtered working signals, the N4 pass-bands being contained one within another from the widest to the narrowest pass-band;
   processing each of the N4 filtered working signals using a peak detection method to detect in each N4 filtered working signal the position of a first wavefront as a time of occurrence;
   associating the width of the pass-band for each of the corresponding N4 filtered working signal with each corresponding time of occurrence;
   defining N4 points each having an ordinate corresponding to one of the times of occurrence and an abscissa corresponding to the width of the associated band;
   plotting the N4 points in a Cartesian system of axes; and
   searching for an exponential asymptote that fits a maximum number of the N4 points, the position of the wavefront reflecting the occurrence of the looked-for event being the ordinate of a point that has the largest abscissa and that is substantially on the exponential asymptote.

2. A method according to claim 1, wherein a discrete Fourier transform is calculated using N1 samples of the working signal, where N1 is an integer, and wherein the discrete Fourier transform is used to define bounds (B2, B3) of the narrowest pass-band ($\beta$min) and bounds (B1, B4) of the widest pass-band ($\beta$max).

3. A method according to claim 2, wherein defining the bounds B2, B3 of the narrowest pass-band $\beta$min comprises:
   selecting the N2 samples having the greatest amplitude from the discrete Fourier transform, where N2 is an integer less than N1; and
   assigning the narrowest pass-band $\beta$min a lower bound B2 that is the lowest frequency of the N2 samples and an upper bound B3 that is the highest frequency of the N2 samples;
   wherein defining the bounds of the widest pass-band $\beta$max comprises:

selecting the N3 samples having the greatest amplitude from the discrete Fourier transform, where N3 is an integer much greater than N2 but less than N1; and assigning the widest pass-band βmax a lower bound B1 that is the lowest frequency of the N3 samples and an upper bound B4 that is the highest frequency of the N3 samples;

the method further comprising verifying that two conditions are satisfied, wherein verifying the two conditions comprises:

verifying that the widest pass-band βmax and the narrowest pass-band βmin have at least one lower bound B1, B2 or one upper bound B3, B4 that is different; and verifying that the narrowest pass-band βmin is contained within the widest pass-band βmax; and if the two conditions are not satisfied, shifting at least one of the bounds (B1, B2, B3, or B4) of the narrowest pass-band βmin or of the widest pass-band βmax such that the two conditions are satisfied.

4. A method according to claim 2, wherein the discrete Fourier transform is smoothed before defining the bounds B2, B3 of the narrowest pass-band βmin and the bounds B1, B4 of the widest pass-band βmax.

5. A method according to claim 2, wherein one or more intermediate pass-bands (βint(1), βint(2)) contained one within another are defined by subdividing a first interval (I1), if it exists, between the lower bound B1 of the widest pass-band βmax and the lower bound B2 of the narrowest pass-band βmin into N+1 parts, where N is an integer greater than or equal to 1, and/or subdividing a second interval (I2), if it exists, between the upper bound B4 of the widest pass-band βmax and the upper bound B3 of the narrowest pass-band βmin into N+1 parts, wherein an interface between two adjacent parts of the first interval I1 forms a lower bound of an intermediate pass-band βint(1), and wherein an interface between two adjacent parts of the second interval I2 forms an upper bound of an intermediate pass-band βint(2).

6. A method according to claim 1, wherein when plotting the N4 points in the Cartesian system of axes, the ordinates of the N4 points are moved in translation through a distance such that after the movement in translation, the point having the lowest ordinate has an ordinate of substantially zero.

7. A method according to claim 6, wherein the position of the wavefront corresponding to the looked-for event is corrected by adding the translation distance to the corresponding ordinate.

8. A method according to claim 1, wherein, prior to searching for the exponential asymptote search, the method comprises selecting a triplet of points having successive increasing abscissas, verifying that the ordinates of these three points are decreasing, discarding any of the points of the triplet if it does not satisfy this decreasing ordinate condition, and progressively repeating the verification with a next triplet including at least one point from the preceding triplet.

9. A method according to claim 8, wherein the comparison is stopped as soon as the number of points discarded reaches (N4)/2.

10. A method according to claim 1, wherein, the detector comprises an acoustic detector, the looked-for event comprises a partial discharge caused by a partial discharge source in electrical equipment placed in an enclosure containing an acoustically-conductive fluid.

* * * * *